(12) United States Patent
Yamanaka et al.

(10) Patent No.: US 8,894,185 B2
(45) Date of Patent: Nov. 25, 2014

(54) LIQUID EJECTION HEAD, INK CARTRIDGE, AND IMAGE FORMING APPARATUS

(75) Inventors: Kunihiro Yamanaka, Kanagawa (JP); Kiyoshi Yamaguchi, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 1189 days.

(21) Appl. No.: 12/669,012

(22) PCT Filed: Sep. 26, 2008

(86) PCT No.: PCT/JP2008/068009
§ 371 (c)(1),
(2), (4) Date: Jan. 13, 2010

(87) PCT Pub. No.: WO2009/063706
PCT Pub. Date: May 22, 2009

(65) Prior Publication Data
US 2010/0194823 A1 Aug. 5, 2010

(30) Foreign Application Priority Data

Nov. 16, 2007 (JP) .................................. 2007-297739

(51) Int. Cl.
*B41J 2/045* (2006.01)
*B41J 2/14* (2006.01)
*H05K 1/14* (2006.01)

(52) U.S. Cl.
CPC .... *B41J 2/14274* (2013.01); *B41J 2002/14491* (2013.01); *B41J 2/04541* (2013.01); *B41J 2002/14362* (2013.01); *H05K 1/147* (2013.01)
USPC .......................................................... 347/58

(58) Field of Classification Search
USPC .................................................... 347/56–59
See application file for complete search history.

(56) References Cited

U.S. PATENT DOCUMENTS

| 6,568,794 B2 | 5/2003 | Yamanaka et al. |
| 6,682,185 B2 | 1/2004 | Hashimoto et al. |
| 6,729,716 B2 | 5/2004 | Eguchi et al. |
| 6,913,348 B2 | 7/2005 | Hashimoto et al. |

(Continued)

FOREIGN PATENT DOCUMENTS

| JP | 10-109410 | 4/1998 |
| JP | 2002-46256 | 2/2002 |

(Continued)

OTHER PUBLICATIONS

Nov. 23, 2010 European search report in connection with counterpart European patent application No. 08 84 9164.

*Primary Examiner* — Jerry Rahll
(74) *Attorney, Agent, or Firm* — Cooper & Dunham LLP

(57) ABSTRACT

A liquid ejection head is disclosed that includes piezoelectric elements constituting driving element rows in which plural driving piezoelectric element columns that generate energy for ejecting liquid droplets from nozzles are arranged side by side; a wiring board arranged on the side opposite to a surface in which the nozzles are formed; and two sheets of flexible printed circuits that are provided to correspond to the piezoelectric elements and have output terminal parts connected to the plural driving piezoelectric element columns and input terminal parts connected to the wiring board, the input terminal parts being drawn to the side of the wiring board. The flexible printed circuits are arranged facing each other with their input terminal parts not facing each other, and the input terminal parts of the flexible printed circuits are folded in a direction where the flexible printed circuits face each other and are connected to the wiring board.

14 Claims, 17 Drawing Sheets

(56) References Cited

U.S. PATENT DOCUMENTS

| | | |
|---|---|---|
| 7,364,253 B2 | 4/2008 | Hashimoto et al. |
| 7,533,957 B2 | 5/2009 | Kaneko et al. |
| 7,621,608 B2 | 11/2009 | Kusunoki et al. |
| 7,764,006 B2 * | 7/2010 | Tsukamura et al. .......... 310/328 |
| 2007/0211092 A1 | 9/2007 | Shingyohuchi et al. |
| 2007/0247026 A1 | 10/2007 | Tsukamura et al. |
| 2007/0252874 A1 | 11/2007 | Duby et al. |
| 2007/0257968 A1 | 11/2007 | Hashimoto et al. |
| 2009/0102907 A1 | 4/2009 | Yamanaka et al. |

FOREIGN PATENT DOCUMENTS

| | | |
|---|---|---|
| JP | 2002-321371 | 11/2002 |
| JP | 2006-62097 | 3/2006 |
| JP | 2007-38489 | 2/2007 |
| JP | 2007-237486 | 9/2007 |

* cited by examiner

LIQUID EJECTION HEAD, INK CARTRIDGE, AND IMAGE FORMING APPARATUS

TECHNICAL FIELD

The present invention relates to a liquid ejection head, an ink cartridge, and an image forming apparatus.

BACKGROUND ART

General image forming (recording) apparatuses, such as printers, facsimile machines, copiers, plotters, or multi-task machines having plural such functions, include a recording head composed of liquid ejection heads that eject liquid droplets of ink so as to form images. During image formation (used synonymously with recording, printing, and imaging), the image forming apparatuses cause the liquid droplets of the ink to adhere to a medium, while transferring the medium (hereinafter referred also to as a sheet, but it does not limit the material; also, it is used synonymously with a medium to be recorded, a recording medium, a transfer member, a recording paper, etc.).

Note that the "image forming apparatuses" refer to apparatuses that eject liquid onto a medium such as a paper, a thread, a fiber, a fabric, leather, metal, a plastic, glass, wood, and a ceramic so as to perform the image formation. Furthermore, the "image formation" refers to forming on the medium not only meaningful images such as characters and graphics, but also meaningless images such as patterns (merely, ejection of liquid droplets). Furthermore, the "ink" is not limited to narrowly-defined ink and is not particularly limited so long as it is liquid when ejected. For example, the ink refers also to a DNA sample, a resist, a pattern material, a resin material, etc.

In such image forming apparatuses, recording speed (printing speed) and image quality have been improved as the processing capacity of information processing apparatuses such as personal computers increases. In order to improve the recording speed, a recording head is formed in an elongated shape by which the number of nozzles is increased, or plural recording heads are connected to each other in line form. Furthermore, in order to improve the image quality, nozzles (heads) are arranged in multiple rows so as to use as many ink colors as possible. Compared with those of conventional apparatuses, recording apparatuses having such recording heads are upsized, which in turn increases their manufacturing costs. Therefore, it is expected to further downsize recording heads and carriages (of a serial type) having such recording heads and reduce their manufacturing costs.

Meanwhile, a flexible printed circuit (hereinafter referred to as a "FPC") is used to transmit electric signals of recording information, etc., from a recording apparatus main body to recording heads (see Patent Document 1).

Patent Document 1: JP-A-10-109410

As a conventional head configuration using the FPC, Patent Document 2 describes one in which the FPCs are provided facing both side surfaces perpendicular to a nozzle surface. Each of the FPCs has one end connected to the actuator of a recording head and the other end connected to a connector electrically connected to the recording apparatus main body.

Patent Document 2: JP-A-2002-046256

Furthermore, Patent Document 3 describes a recording apparatus having a flexible wiring board that serves as one transformed into two shapes. Therefore, a pair of the flexible wiring boards is provided to correspond to respective connection parts of a recording head, while the wiring boards face each other at connections with connection parts. The flexible wiring boards are folded at almost a right angle relative to the longitudinal direction between the recording head and a driving circuit board and folded back 180 degrees.

Patent Document 3: JP-A-2002-321371

However, according to the above configuration of Patent Document 2, connector parts are also caused to face each other together with the FPCs, which in turn makes it impossible to reduce the width (in width direction) of the recording head.

In addition, according to the above configuration of Patent Document 2, the flexible wiring board is folded back to use the same part so as to reduce the cost of parts. However, the downsizing of a carriage including the recording head and the reduction of the cost of the parts accompanied by the downsizing of the flexible wiring board are insufficient.

Moreover, as shown in FIG. 1, in the case of a line-type head unit 1000 for use in a line-type image forming apparatus in which plural short heads 1001 are arranged in a staggered manner and held on a head supporting member 1002, the head unit 1000 itself is large. As a result, the image forming apparatus including the head unit 1000 becomes extremely large. The length "L" of the head unit 1000 depends on the size of a recording medium to be used in the image forming apparatus. On the other hand, the width "W" of the head unit 1000 does not depend on the recording medium, but directly influences the size of the image forming apparatus regardless of the size of the recording medium. Because the head 1001 has the width "w" in this example, the width "W" of the head unit 1000 becomes at least "2w." Therefore, the reduction of the width "W" of the head unit 1000 is accompanied by the reduction of the width "w" of the head unit 1001.

Thus, it is important to reduce the width of the head unit so as to downsize the line-type image forming apparatus main body, and it is desired that the width of the heads constituting the head unit be reduced to downsize the recording head. In a serial-type image forming apparatus as well, if the width of the recording head is large, the width of a scanning carriage becomes large, which in turn disturbs the downsizing of the image apparatus main body and high-speed printing. Therefore, the reduction of the width of the heads is desired.

DISCLOSURE OF THE INVENTION

The present invention has been made in view of the above problems and may attain the downsizing of a recording head.

According to an aspect of the present invention, there is provided a liquid ejection head comprising at least two driving element rows in which plural driving elements that generate energy for ejecting a liquid droplet from a nozzle are arranged side by side; a wiring board arranged on a side opposite to a surface in which the nozzle is formed; and at least two sheets of flexible printed circuits that are provided to correspond to the respective driving element rows and have output terminal parts connected to the plural driving elements and input terminal parts connected to the wiring board, the input terminal parts being drawn to the side of the wiring board. The flexible printed circuits are arranged facing each other with their input terminal parts not facing each other, and the input terminal parts of the flexible printed circuits are folded in a direction where the flexible printed circuits face each other and are connected to the wiring board.

According to another aspect of the present invention, there is provided a liquid ejection head comprising three or more driving element rows in which plural driving elements that generate energy for ejecting a liquid droplet from a nozzle are arranged side by side; a wiring board arranged on a side opposite to a surface in which the nozzle is formed; and at least three or more rows of flexible printed circuits that are provided to correspond to the respective driving element rows and have output terminal parts connected to the plural driving elements and input terminal parts connected to the wiring board, the input terminal parts being drawn to a side of the wiring board. The input terminal parts of the flexible printed circuits are folded and connected to the wiring board, the input terminal parts of the flexible printed circuits being positioned outside from among the three or more rows of the flexible printed circuits being folded in a direction where the flexible printed circuits are arranged and connected to the wiring board.

A space between the input terminal parts in a direction where the input terminal parts of the flexible printed circuits are arranged may be positioned at a central part between the driving element rows. Furthermore, the input terminal parts of the flexible printed circuits may be provided parallel to the output terminal parts, and a length of the input terminal parts may be half or less of a length of the output terminal parts in a direction of the driving element rows. Furthermore, the plural flexible printed circuits may be identical in shape.

According to still another aspect of the present invention, there is provided a liquid ejection head comprising at least two driving element rows in which plural driving elements that generate energy for ejecting a liquid droplet from a nozzle are arranged side by side; a wiring board arranged on a side opposite to a surface in which the nozzle is formed; and a sheet of flexible printed circuit that is provided to correspond to the driving element rows and has output terminal parts connected to the plural driving elements and input terminal parts connected to the wiring board. The flexible printed circuit has first and second input terminal parts, and at least parts of wiring areas continuing to the first and second input terminal parts face each other, the first and second input terminal parts being folded in a direction where at least the parts of the wiring areas continuing to the first and second input terminal parts face each other and are connected to the wiring board, and the first and second input terminal parts are arranged at positions where the first and second input terminal parts do not face each other in the direction where at least the parts of the wiring areas continuing to the first and second input terminal parts face each other.

The wiring board may be a print wiring board having a bypass condenser mounted thereon.

According to still another aspect of the present invention, there is provided an ink cartridge in which an ink jet head and an ink tank are integrated with each other, wherein the ink jet head is the liquid ejection head described above.

According to still another aspect of the present invention, there is provided an image forming apparatus having the liquid ejection head described above or the ink cartridge described above.

In a liquid ejection head according to the embodiments of the present invention, plural input terminal parts do not face each other. Therefore, it is possible to reduce the size of a head in its width direction and attain the downsizing of the head.

In an ink cartridge according to the embodiments of the present invention, a liquid ejection head according to the embodiments of the present invention is integrally provided. Therefore, it is possible to attain the downsizing of a cartridge.

In an image forming apparatus according to the embodiments of the present invention, the liquid ejection head according to the embodiments of the present invention is provided. Therefore, it is possible to attain the downsizing of an apparatus main body.

BEST MODE FOR CARRYING OUT THE INVENTION

Figure 2:
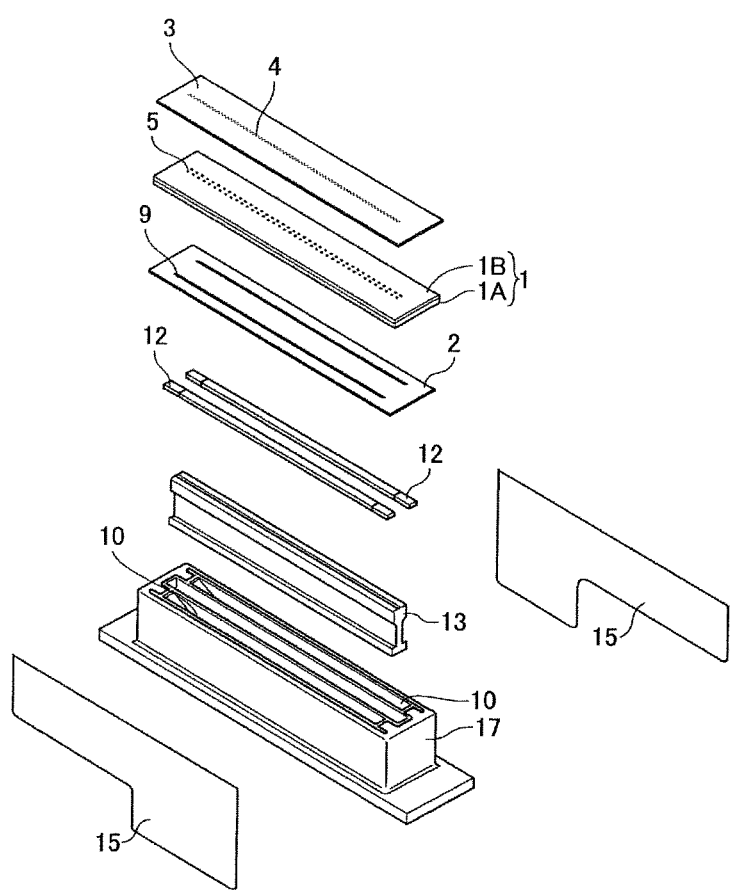
FIG. 2 is an exploded perspective explanatory view showing an example of a liquid ejection head to which the embodiments of the present invention are applied.
Figure 3:
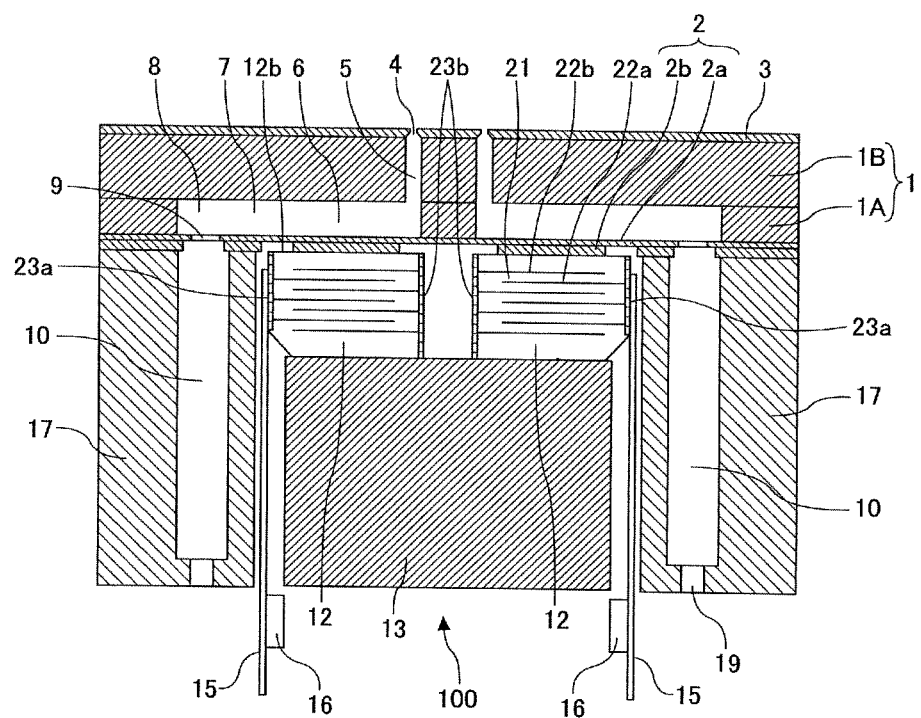
FIG. 3 is a cross-sectional explanatory view along the direction orthogonal to the nozzle arrangement direction of the head.
Figure 4:
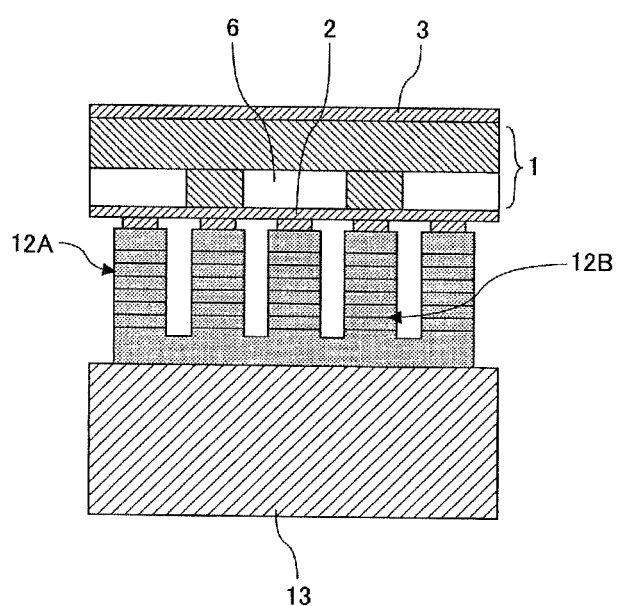
FIG. 4 is a cross-sectional explanatory view along the nozzle arrangement direction of the head.
Figure 5:
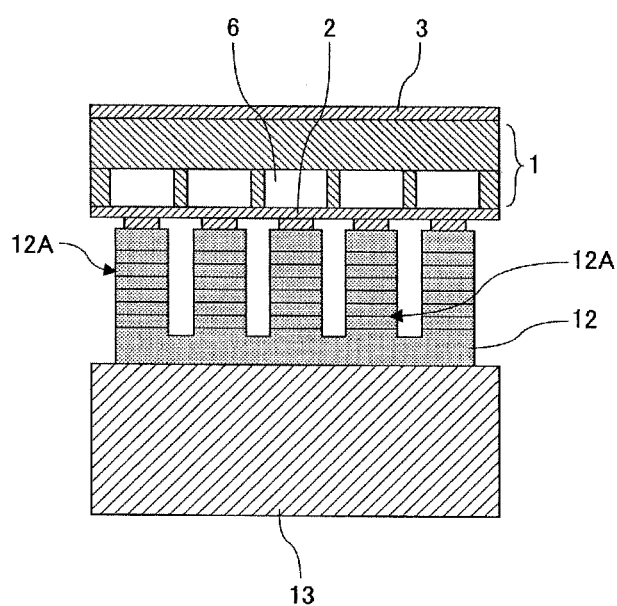
FIG. 5 is a cross-sectional explanatory view of another example along the nozzle arrangement direction of the head.

Referring to the accompanying drawings, embodiments of the present invention are described. First, an example of a liquid ejection head according to the embodiments of the present invention is described based on FIGS. 2 through 5. Note that FIG. 2 is an exploded perspective explanatory view of the head, FIG. 3 is a cross-sectional explanatory view along the direction (longitudinal direction of liquid chambers) orthogonal to the nozzle arrangement direction of the head, and FIGS. 4 and 5 are cross-sectional explanatory views of other examples along the nozzle arrangement direction (width direction of the liquid chambers) of the head.

The liquid ejection head has a flow path board (liquid chamber board) 1 made of an SUS board, a vibrating plate member 2 bonded to the lower surface of the flow path board 1, and a nozzle plate 3 bonded to the upper surface of the flow path board 1. With these parts, there are formed plural liquid chambers 6 (referred also to as pressurizing liquid chambers, pressure chambers, pressurizing chambers, flow paths, etc.) serving as separate flow paths with which plural nozzles 4 for ejecting liquid droplets communicate through nozzle communication paths 5, fluid resisting parts 7 that serve also as supplying paths for supplying ink to the liquid chambers 6, and communication parts 8 that communicate with the liquid chambers 6 through the fluid resisting parts 7. The ink is supplied from common liquid chambers 10 formed in a frame member 17 described below to the communication parts 8 through supplying ports 9 formed in the vibrating plate member 2.

The flow path board 1 is bonded with a flow path plate 1A and a communication plate 1B. In the flow path board 1, the openings of the communication paths 5, the pressurizing liquid chambers 6, the fluid resisting parts 7, etc., are formed by etching the SUS board using an acid etching liquid or applying machine work such as punching (pressing) to the SUS board.

The vibrating plate member 2 is composed of vibration areas (diaphragm parts) 2a forming the wall surfaces of the liquid chambers 6 and composed of convex parts 2b formed on the outside (on the side opposite to the liquid chambers 6) of the surfaces of the vibration areas 2a. The convex parts 2b are bonded to the upper end surfaces (bonding surfaces) of piezoelectric element columns 12A and 12B of laminated piezoelectric elements 12 that deform the vibration areas 2a into the convex parts 2b and serve as driving elements (actuator units or pressure generation units) that generate energy for ejecting liquid droplets. Furthermore, the lower end surfaces of the laminated piezoelectric elements 12 are bonded to a base member 13.

Here, the piezoelectric elements 12 have piezoelectric material layers 21 made of PZT, etc., and internal electrodes 22a and 22b alternately laminated with each other. The internal electrodes 22a and 22b are drawn to end surfaces, i.e., side surfaces substantially orthogonal to the vibrating plate member 2 of the piezoelectric elements 12 and connected to end surface electrodes (external electrodes) 23a and 23b, respectively, formed on the side surfaces. When a voltage is applied to the end surface electrodes (external electrodes) 23a and 23b, displacements in the laminated direction are caused. The piezoelectric elements 12 are formed into a required number of the piezoelectric columns 12A and 12B by applying groove work using half cut dicing to one piezoelectric element.

Note that the piezoelectric element columns 12A and 12B of the piezoelectric elements 12 are the same. However, the piezoelectric element columns 12A receive driving waveforms so as to be driven, while the piezoelectric element columns 12B do not receive driving waveforms and serve only as supporting columns. In this case, any of a hi-pitch configuration in which the driving piezoelectric element columns 12A and the supporting piezoelectric element columns 12B are alternately arranged as shown in FIG. 4, or a normal-pitch configuration in which only the driving piezoelectric element columns 12A are used as the piezoelectric element columns as shown in FIG. 5 can be employed.

Accordingly, two driving element rows (two rows of the driving piezoelectric element columns 12A) are provided in which plural of the driving piezoelectric element columns 12A as driving elements are arranged side by side on the base member 13.

In addition, the pressure of the ink in the liquid chambers 6 is increased using a displacement in the direction "d33" as the piezoelectric direction of the laminated piezoelectric elements 12. Alternatively, the pressure of the ink in the pressurizing liquid chambers 6 may be increased using a displacement in the direction "d31" as the piezoelectric direction thereof.

Furthermore, the material used for the piezoelectric elements is not limited to the embodiments, but electromechanical conversion elements of ferroelectric substances, such as $BaTiO_3$, $PbTiO_3$, and $(NaK)NbO_3$ generally used as piezoelectric element materials, may be used. Moreover, instead of the laminated piezoelectric elements, single-plate piezoelectric elements may be used. As single-plate piezoelectric elements, there are employed those formed through cutting work, those having a thick film formed through screen printing and sintering, or those having a thin film formed through a sputtering method, an evaporation method, or a sol-gel method. Furthermore, one or plural rows of the laminated piezoelectric elements 12 may be provided on the base member 13.

Furthermore, FPCs (Flexible Printed Circuits) 15 as wiring units are directly connected to the external electrodes 23a of the driving piezoelectric element columns 12A of the piezoelectric elements 12 by solder so as to transmit driving signals. The FPCs 15 have mounted thereon driving ICs (Integrated Circuits) 16 for selectively applying driving waveforms to the driving piezoelectric element columns 12A of the piezoelectric elements 12. Note that the external electrodes 23a of all the driving piezoelectric element columns 12A are electrically connected in common and connected to the common wirings of the FPCs 15 by solder. Here, in order to enable solder bonding, solder plating is applied to the output terminal parts of the FPCs 15 so as to be bonded to piezoelectric elements 12. Alternatively, it may be applied to the piezoelectric elements 12. Furthermore, a bonding method using an anisotropic conductive film or wire bonding may be used as bonding methods.

The nozzle plate 3 is made of nickel (Ni) and manufactured by an electroforming method. The nozzle plate 3 has nozzles 4 each having a diameter of 10 through 35 μm so as to correspond to the liquid chambers 6 and is bonded to the flow path plate 1 by an adhesive. The surface (front surface in the ejection direction (ejection surface) or the surface opposite to the side of the liquid chambers 6) on the liquid ejection side of the nozzle plate 3 is provided with a water-repellent layer.

Furthermore, a frame member 17 formed by injection molding using an epoxy-based resin or polyphenylene sulfite is bonded to the peripheral side of a piezoelectric actuator unit 100 composed, for example, of the piezoelectric elements 12 on which the FPCs 15 are mounted and the base member 13. The frame member 17 has the common liquid chambers 10 and supplying ports 19 for supplying ink from outside to the common liquid chambers 10. The supplying ports 19 are connected to ink supplying sources such as sub-tanks and ink cartridges (not shown).

In the liquid droplet ejection head thus configured, when a voltage applied to the driving piezoelectric element columns 12A is made lower than a reference potential, the driving piezoelectric element columns 12A contract. Then, the vibrating plates 2 are lowered (bent) to expand the volume of the liquid chambers 6, so that ink flows into the liquid chambers 6. After this, the voltage applied to the driving piezoelectric element columns 12A is increased to expand the piezoelectric element columns 12 in the laminated direction and deform the vibrating plates 2 in the direction of the nozzles 4 to reduce the volume of the liquid chambers 6. As a result, the pressure of the ink in the liquid chambers 6 is increased, so that ink droplets are ejected from the nozzles 4.

Then, when the voltage applied to the driving piezoelectric element columns 12A is restored to the reference potential, the vibrating plate 2 is restored to its initial position, and then the liquid chambers 6 are expanded to generate negative pressure. At this time, the ink is supplied from the common liquid chambers 10 to the liquid chambers 6. After the vibration of the meniscus of the ink in each of the nozzles 4 is attenuated and stabilized, the liquid ejection head moves to operations for the next liquid droplet ejection.

Note that the method for driving the head is not limited to the above example (pull and push ejection), but pull ejection, push ejection, etc., can be performed depending on how driving waveforms are applied.

Figure 6:
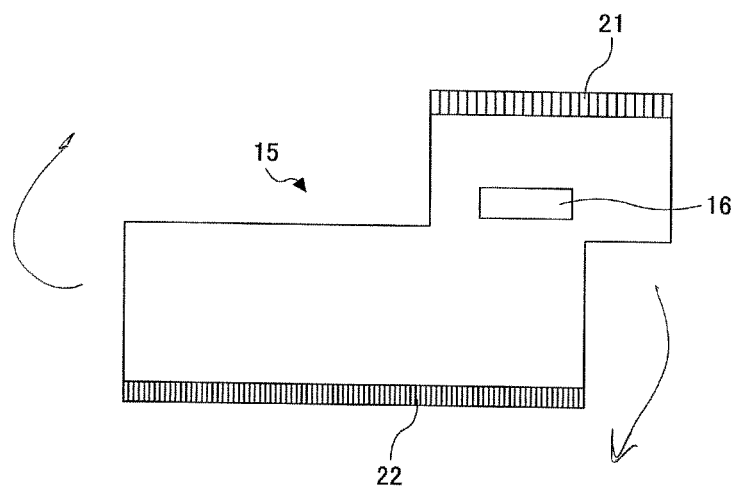
FIG. 6 is an explanatory view of a FPC according to a first embodiment of the present invention.
Figure 7:
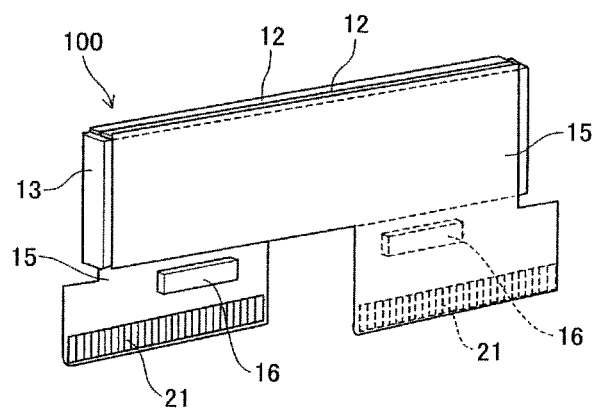
FIG. 7 is a perspective explanatory view of an actuator unit of a head having the FPCs mounted thereon.
Figure 8:
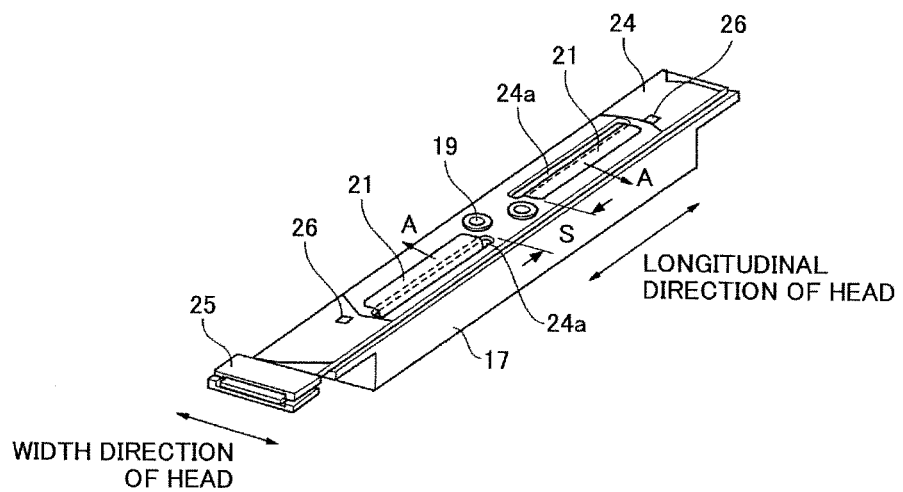
FIG. 8 is a perspective explanatory view of the head having a wiring board mounted thereon as seen from the side opposite to a nozzle surface.

Referring to FIGS. 6 through 8, a first embodiment of the present invention is described. Note that FIG. 6 is an explanatory view of the FPC 15, FIG. 7 is a perspective explanatory view of the actuator unit 100 of the head having the FPCs 15 mounted thereon, and FIG. 8 is a perspective explanatory view of the head having a wiring board mounted thereon as seen from the side opposite to a nozzle surface.

As shown in FIG. 6, the driving IC 16 is mounted on the FPC 15 for selectively applying driving waveforms to the driving piezoelectric element columns 12A of the piezoelectric elements 12 as the driving elements 12A. The number of wirings is increased as the number of nozzles increases. If the driving IC 16 is mounted on a controlling part for an apparatus main body (hereinafter referred to as a "main body controlling part") or a relay board connected to the main body controlling part, it becomes difficult to realize packaging for connecting the driving elements 12A (driving piezoelectric element columns 12A) and the driving IC 16 to each other. However, if the wirings for connecting the driving elements 12A and the driving IC 16 to each other are carried out by the FPC 15 capable of performing wiring processing at fine pitches, it becomes easier to realize the packaging. In addition, it is possible to reduce the number of connection wirings with the main body controlling part and an intermediate board connected to the main body controlling part, thus facilitating the connection to the main body controlling part. Moreover, in order to transmit signals at high speed, it is preferable that the driving elements 12A and the driving IC 16 have small wiring capacity. Furthermore, it is preferable that the driving IC 16 be mounted on the FPC 15 connected to the driving elements 12A so that the driving IC and the driving elements 12A are connected to each other at the shortest distance.

Here, the FPC 15 has a connection terminal part (output terminal part) 22 which is connected to the piezoelectric element 12 and a connection terminal part (input terminal part) 21 to which data and signals from the main body controlling part are input. In this case, the input terminal part 21 is formed in a position offset from the center to the end of the output terminal part 22. Accordingly, as shown in FIG. 8, it is possible to provide a space S at the central part between the driving element rows (piezoelectric elements 12) and arrange the ink supplying ports 19 near the center in the longitudinal direction of the head. With this configuration, it is possible to arrange the ink supplying ports 19 near the center in the longitudinal direction of the head and stably supply ink to the common liquid chambers 10.

As described above, in the actuator unit 100, two rows of the piezoelectric elements 12 having the plural driving piezoelectric elements 12A and 12A are arranged on the base board (base member) 13. In order to correspond to the rows of the driving piezoelectric element columns 12A and 12A, two identical (sheets) of the FPCs 15 are provided facing each other in such a manner as to hold the base board 13 between them. At this time, the input terminal parts 21 are arranged at positions where they do not face each other.

As shown in FIG. 8, opening parts 24a through which the input terminal parts 21 of the FPCs 15 pass are formed in a print wiring board 24 mounted on the side of the rear surface (surface on the side opposite to the nozzle surface) of the frame member 17. Parts including the input terminal parts 21 of the FPCs 15, which pass through the two opening parts 24a, are folded in directions (as indicated by arrows A) where the FPCs 15 face each other. The input terminal parts 21 of the FPCs 15 are connected to the connection terminal part of the print wiring board 24 so as to be electrically conducted.

Because the input terminal parts 21 of the FPCs 15 do not face each other at this time, they do not interfere with each other. Therefore, it is possible to perform packaging in a limited space without increasing the size of the head in its width direction (the direction orthogonal to the alignment direction of the piezoelectric elements 12, i.e., the arrangement direction of the nozzles 4), thus attaining the downsizing of the head.

Here, the print wiring board 24 is provided with a connector 25 for connection to the board of the main body controlling part, and the connector 25 facilitates the connection to the main body controlling part. Furthermore, as shown in FIG. 8, it is preferable that bypass condensers 26 be mounted on the print wiring board 24. Thus, the bypass condensers 26 for stably supplying signals to the driving ICs 16 are mounted not on the FPCs 15 but on the print wiring board 24, thereby making it possible to reduce the cost of the FPCs 15 as expensive parts. On the other hand, if a FFC (Flexible Flat Cable) is used instead of the print wiring board 24, it is necessary to mount the bypass condensers on the FPCs closer to the driving ICs 16. In this case, the costs of the FPC are increased along with its upsizing.

As described above, according to the configuration of this embodiment, there are provided at least the two driving element rows in which the plural driving elements that generate energy for ejecting liquid droplets from the nozzles are arranged side by side and at least the two FPCs that are provided to correspond to the driving element rows and have the output terminal parts connected to the plural driving elements and the input terminal parts connected to the wiring board. The FPCs are arranged facing each other with their input terminal parts not facing each other, and the input terminal parts of the FPCs are folded in the direction where the FPCs face each other and are connected to the wiring board. Accordingly, it is possible to attain the downsizing of the head.

Note that in this embodiment the piezoelectric elements are used as the driving elements, but the driving elements are not limited to them. This embodiment can also be applied to heads using, as the driving elements, a thermal actuator that employs electric thermal conversion elements such as heat generation resistances to use phase changes due to the film boiling of a liquid, a shape-memory alloy actuator that employs metal phase changes due to the change of temperature, an electrostatic actuator that employs an electrostatic force, etc., (the same applies to the embodiments described below).

Figure 9:
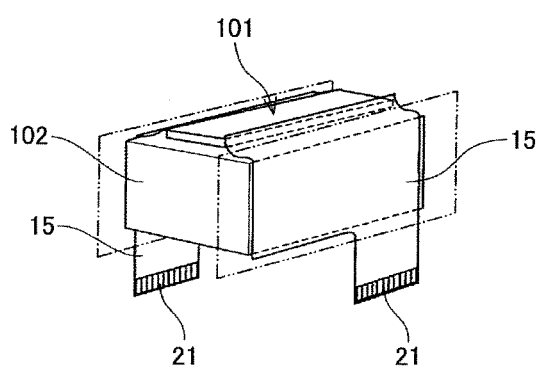
FIG. 9 is a perspective explanatory view for explaining a second embodiment of the present invention.

Referring to FIG. 9, a description is now made of a second embodiment of the present invention. Note that FIG. 9 is a perspective explanatory view for explaining this embodiment.

In this embodiment, an electrostatic actuator unit 101 having two driving element rows in which plural rows of electrostatic actuators as driving elements are arranged side by side is arranged on a base member 102, and two sheets of the FPCs 15 are provided to correspond to the driving element rows of the electrostatic actuator unit 101.

In this case, the two sheets of the FPCs 15 are arranged facing each other in such a manner as to be folded and arranged one adjacent to each side surface of the base member 102. That is, the FPCs "arranged facing each other" in the present invention refer to those that are folded to have facing surfaces (opposite surfaces) although they do not face each other at their parts connected to the driving elements.

Figure 10:
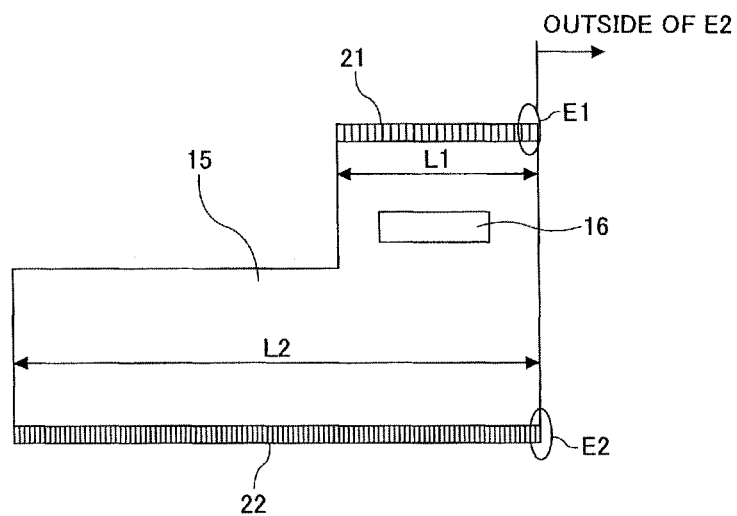
FIG. 10 is an explanatory view of a FPC according to a third embodiment of the present invention.
Figure 11:
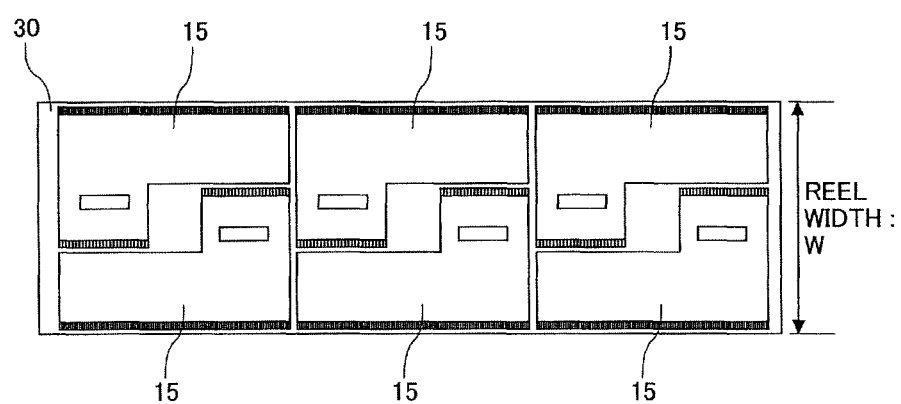
FIG. 11 is an explanatory view for explaining how to extract the FPCs.
Figure 12:
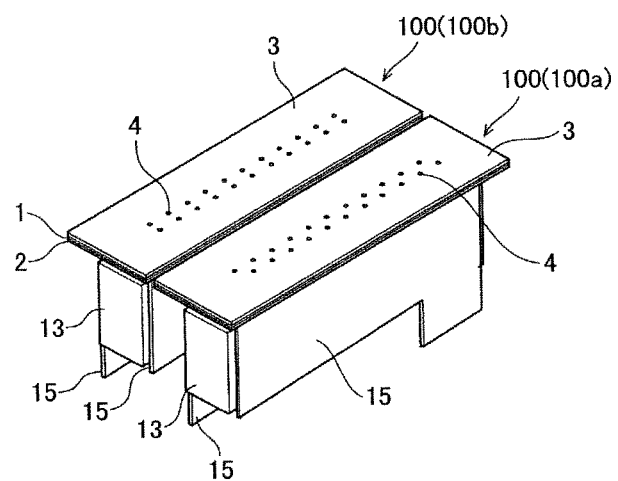
FIG. 12 is a schematic explanatory perspective view of a head according to the third embodiment.
Figure 13:
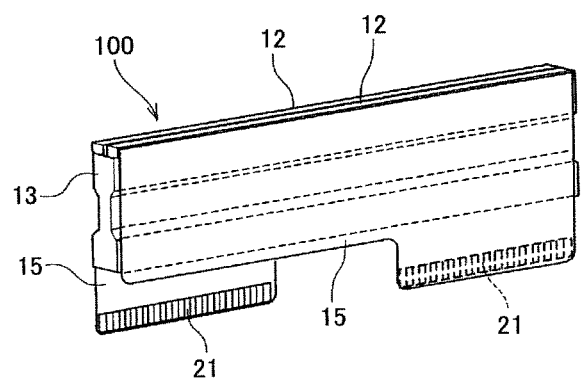
FIG. 13 is a perspective explanatory view of an actuator unit of the head having the FPCs mounted thereon.
Figure 14:
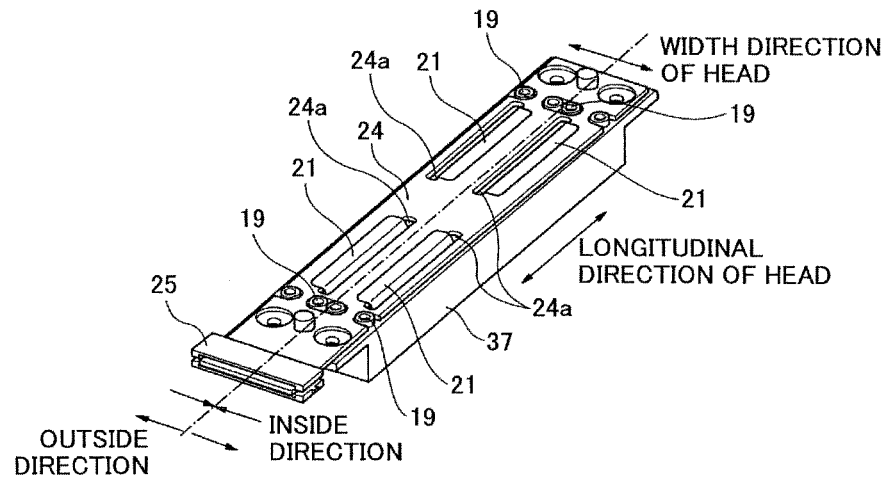
FIG. 14 is a perspective explanatory view of the head having a wiring board mounted thereon as seen from the side opposite to a nozzle surface.

Referring to FIGS. 10 through 14, a description is now made of a third embodiment of the present invention. Note that FIG. 10 is an explanatory view of the FPC 15, FIG. 11 is an explanatory view for explaining how to extract the FPCs 15, FIG. 12 is a schematic explanatory perspective view of a head according to this embodiment, FIG. 13 is a perspective explanatory view of an actuator unit of the head having the FPCs 15 mounted thereon, and FIG. 14 is a perspective explanatory view of the head having a wiring board mounted thereon as seen from the side opposite to a nozzle surface.

Here, as shown in FIG. 10, the FPC 15 is so arranged that the length "L1" of the input terminal part 21 is half or less of the length "L2" of the output terminal part 22, the input terminal part 21 is formed in a position biased from the center to the end of the output terminal end 22, and the end "E1" of the input terminal part 21 is positioned so as not to be outside of the end "E2" of the output terminal part 22.

Accordingly, it is possible to prevent the upsizing of the head in its longitudinal direction compared with the FPC 15 according to the first embodiment in FIG. 6. Furthermore, as shown in FIG. 11, the FPC 15 is generally manufactured in such a manner that wiring patterns for each component and the driving ICs 16 are repeatedly formed on a reel-shaped film material 30. It is preferable that the material costs of the FPC be reduced as much as possible because the FPCs are expensive. Furthermore, from the viewpoint of reducing the costs, it is important to extract as many parts as possible from the reel-shaped film material 30 having a certain width. In the example shown in FIG. 11, the film material 30 having the reel width "W" is arranged so as to provide two FPCs 15. The FPC 15 is formed into the shape shown in FIG. 10, thereby making it possible to increase the number of parts extracted from the film material 30 having the reel width "W."

According to this embodiment, as shown in FIG. 12, the head is so configured that two actuator units 100 (100a and 100b) are arranged side by side in the direction orthogonal to the nozzle arrangement direction and four rows of the piezoelectric elements 12 (four driving element rows) are provided. Note that the two actuator units 100a and 100b are accommodated in a frame member 37. Furthermore, similar to the case of the second embodiment, the two identical FPCs 15 are provided facing each other in such a manner as to hold the base member 13 between them in the actuator unit 100, and the input terminal parts 21 of the FPCs 15 do not face each other. Accordingly, four rows of the FPCs 15 are arranged in the direction orthogonal to the alignment direction of the driving elements.

On the other hand, as shown in FIG. 14, the print wiring board 24 is mounted on the side of the rear surface of the frame member 37. The opening parts 24a through which the input terminal parts 21 of the FPCs 15 pass are formed in the print wiring board 24. Parts including the input terminal parts 21 of the FPCs 15, which pass through the opening parts 24a, are folded in the direction where the FPCs 15 face each other. The input terminal parts 21 of the FPCs 15 are connected to the connection terminal part of the print wiring board 24 so as to be electrically connected.

Because the input terminal parts 21 of the FPCs 15 do not face each other at this time, they do not interfere with each other. Therefore, it is possible to perform packaging in a limited space without increasing the size of the head in its width direction, thus attaining the downsizing of the head.

As described above, according to the configuration of this embodiment, there are provided the three or more driving element rows in which the plural driving elements that generate energy for ejecting liquid droplets from the nozzles are arranged side by side; the wiring board arranged on the side opposite to the surface in which the nozzles are formed; and at least the three or more rows of the FPCs that are provided to correspond to the driving element rows and have the output terminal parts connected to the plural driving elements and the input terminal parts connected to the wiring board, the input terminal parts being drawn to the side of the wiring board. The input terminal parts of the FPCs are folded and connected to the wiring board. In this case, the input terminal parts of the FPCs positioned outside from among the three or more rows of the FPCs are folded in the direction where the FPCs are arranged and connected to the wiring board. Accordingly, it is possible to attain the downsizing of the head without increasing the size of the head in its width direction.

Figure 15:
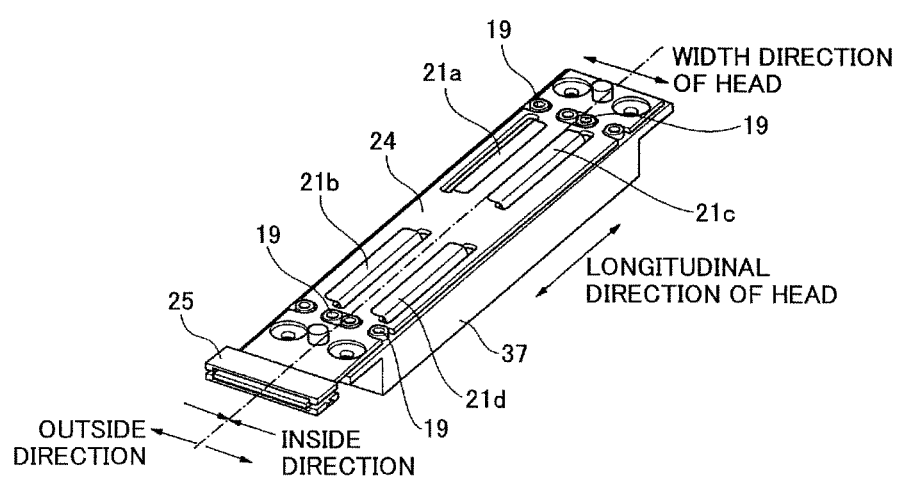
FIG. 15 is a perspective explanatory view of a head having mounted thereon a wiring board as seen from the side opposite to a nozzle surface according to a fourth embodiment of the present invention.

Referring to FIG. 15, a description is now made of a fourth embodiment of the present invention. Note that FIG. 15 is a perspective explanatory view of a head having mounted thereon a wiring board as seen from the side opposite to a nozzle surface according to this embodiment.

Here, the input terminal parts 21 of four rows of the FPCs 15 are indicated as input terminal parts 21a, 21b, 21c, and 21d. Among them, the input terminal parts 21b and 21c are arranged on the inner side of the head. In this case, the folding directions of the input terminal parts 21a and 21c are not limited. However, in order to downsize the head in its width direction, it is necessary to fold the input terminal parts 21a and 21d of the FPCs 15 arranged on the outer side of the head in the inside direction of the head and connect them to the wiring board.

That is, in this example, the input terminal part 21c is folded in the inside direction of the head, while the input terminal part 21b is folded in the outside direction thereof. Accordingly, unlike the FPCs of the input terminal parts 21a, 21b, and 21d, the FPC of the input terminal part 21c has a terminal surface at the opposite surface and serves as a part having a different configuration. Furthermore, according to this embodiment, two sheets of the FPCs 15 are connected to each actuator unit 100, whereby four rows of the FPCs 15 are arranged. However, the number of the rows to be arranged is not particularly limited to this embodiment so long as it is three or more.

Figure 16:
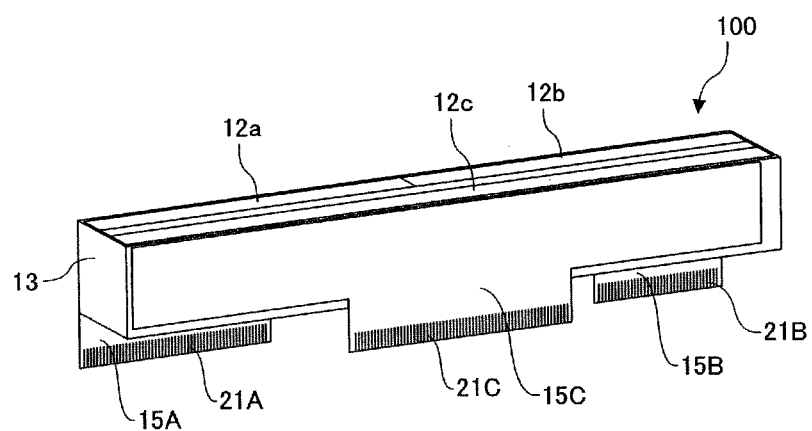
FIG. 16 is a perspective explanatory view of an actuator unit of the head having the FPCs mounted thereon according to a fifth embodiment of the present invention.

Referring to FIG. 16, a description is now made of a fifth embodiment of the present invention. Note that FIG. 16 is a perspective explanatory view of an actuator unit of the head having the FPCs mounted thereon according to this embodiment.

In the actuator unit 100, relatively short piezoelectric elements 12a and 12b are arranged on the base member 13 side by side, and the piezoelectric elements 12a and 12b and a piezoelectric element 12c having a length corresponding to the length of the piezoelectric elements 12a and 12b are arranged in parallel.

FPCs 15A and 15B are connected to corresponding surfaces of the piezoelectric elements 12a and 12b, respectively, and a FPC 15C is connected to the piezoelectric element 12c through the base member 13C so as to face the FPCs 15A and 15B.

Here, an input terminal part 21C of the FPC 15C is provided so as not to face input terminal parts 21A and 21B of the FPCs 15A and 15B. Although not shown in FIG. 16, the input terminal parts 21C, 21A, and 21B are folded in the direction where the FPC 15C and the FPCs 15A and 15B face each other and connected to the print wiring board 24 similar to the case of the first embodiment.

As described above, the input terminal parts of the FPCs provided facing each other are configured so as not to face each other regardless of the number of the FPCs and the driving element rows. Accordingly, the connection terminals (input terminal parts) do not interfere with each other. Therefore, it is possible to prevent the upsizing of the head in its width direction, i.e., it is possible to perform packaging in a limited space, thus attaining the downsizing of the head.

Figure 17:
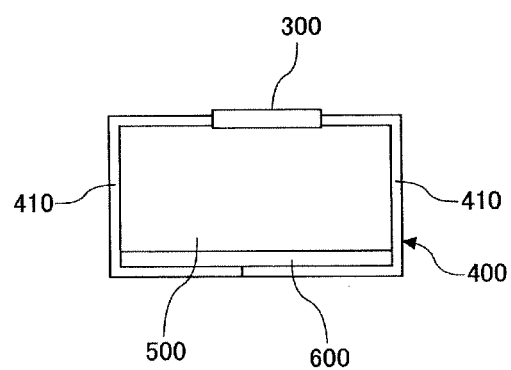
FIG. 17 is a side explanatory view of a head-integrated cartridge (head unit) having a FPC mounted thereon according to a sixth embodiment of the present invention.
Figure 18:
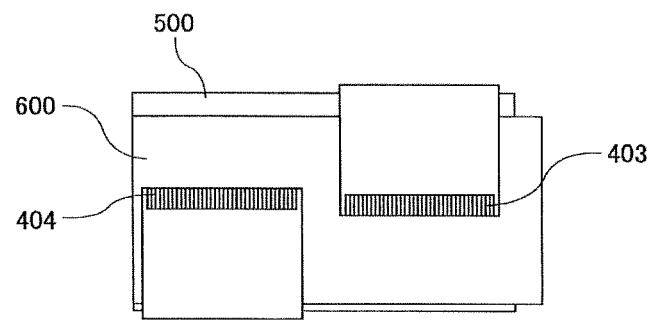
FIG. 18 is a bottom explanatory view of the head unit as seen from the side of an ink tank.
Figure 19:
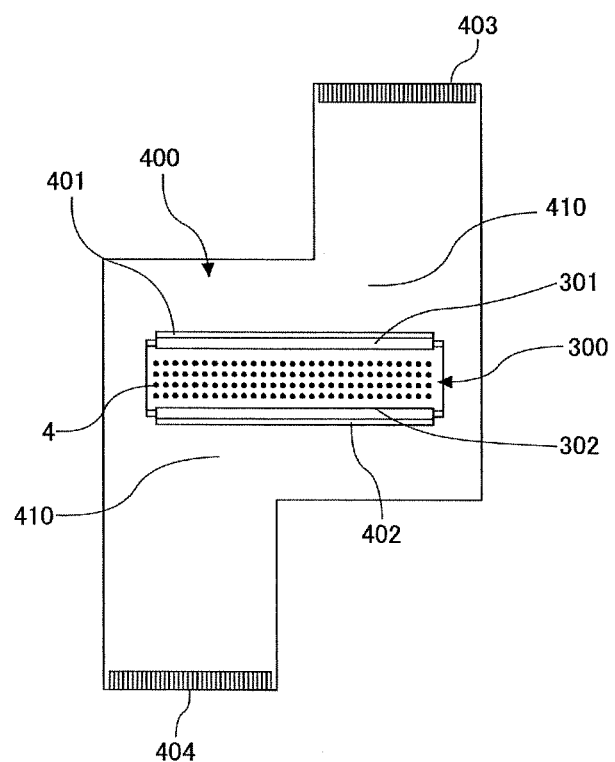
FIG. 19 is a plan explanatory view showing the FPC having a head mounted thereon.
Figure 20:
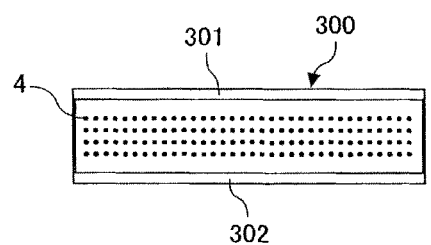
FIG. 20 is a plan explanatory view of the head.
Figure 21:
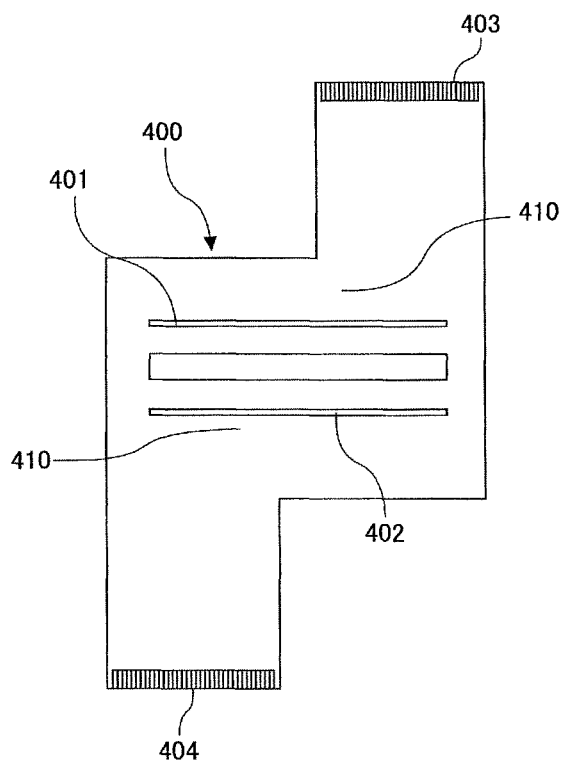
FIG. 21 is an explanatory view of the FPC.

Referring to FIGS. 17 through 21, a description is now made of a sixth embodiment of the present invention. Note that FIG. 17 is a side explanatory view of a head-integrated cartridge (head unit) having a FPC mounted thereon according to this embodiment, FIG. 18 is a bottom explanatory view of the head unit as seen from the side of an ink tank, FIG. 19 is a plan explanatory view showing the FPC having a head mounted thereon, FIG. 20 is a plan explanatory view of the head, and FIG. 21 is an explanatory view of the FPC.

Here, a liquid ejection head 300 using an electrostatic actuator as a driving element and an ink tank 500 as a liquid container that supplies ink to the head 300 are integrated to constitute an ink cartridge (head unit) as a liquid cartridge. Furthermore, a FPC 400 is mounted on the head 300.

As shown in FIG. 19, the head 300 has four nozzle rows in which nozzles 4 are arranged side by side and connection terminal groups 301 and 302. The FPC 400 connected to the electrostatic actuator (driving element) of the head 300 has first and second output terminal parts 401 and 402 and two first and second input terminal parts 403 and 404. The first and second input terminal parts 403 and 404 are arranged at different positions in the longitudinal (nozzle arrangement) direction of the head 300 and at positions where they are not overlapped with each other when folded in the direction orthogonal to the nozzle arrangement direction.

Furthermore, as shown in FIGS. 20 and 21, the head 300 and the FPC 400 are connected to each other in such a manner that the connection terminal groups 301 and 302 are connected to the output terminal parts 401 and 402, respectively, by wire bonding. Note that as connecting methods other than the wire bonding, it is also possible to use an anisotropic conductive film or solder. On the other hand, as shown in FIG. 17, a print wiring board 600 is provided on the side of the rear surface of the ink tank 500. When the FPC 400 is mounted in such a manner as to enclose the ink tank 500, the first and second input terminal parts 403 and 404 are connected to the print wiring board 600 with at least parts of wiring areas 410 continuing to the input terminal parts 403 and 404 facing each other through the ink tank 500.

In this case, as shown in FIG. 21, because the first and second input terminal parts 403 and 404 of the FPC 400 are not overlapped with each other, they do not interfere with each other. Therefore, it is possible to reduce the size of the head unit in its width direction and perform packaging in a limited space, thus attaining the downsizing of the head. The head unit of this embodiment is formed into the ink cartridge in which the ink tank and the head are integrated with each other. That is, this embodiment provides the small ink cartridge in the width direction of the head.

As described above, according to the configuration of this embodiment, there are provided at least the two driving element rows in which the plural driving elements that generate energy for ejecting liquid droplets from the nozzles are arranged side by side; the wiring board arranged on the side opposite to the surface in which the nozzles are formed; and the one sheet of the FPC that is provided to correspond to the driving element rows and has the output terminal parts connected to the plural driving elements and the input terminal parts connected to the wiring board. The FPC has the first and second input terminal parts, and at least the parts of the wiring areas continuing to the first and second input terminal parts of the FPC face each other. Furthermore, the first and second input terminal parts are folded in the direction where at least the parts of the wiring areas continuing to the first and second input terminal parts face each other and are connected to the wiring board, the first and second input terminal parts being arranged at the positions where the first and second input terminal parts do not face each other in the direction where at least the parts of the wiring areas continuing to the first and second input terminal parts face each other. Accordingly, it is possible to attain the downsizing of the head and the head-integrated ink cartridge.

Note that this embodiment provides the ink cartridge in which the ink tank and the head are integrated. However, a part corresponding to the ink tank may be an intermediate unit with the ink tank or a head supporting board, and the present invention is not limited to this embodiment.

Figure 22:
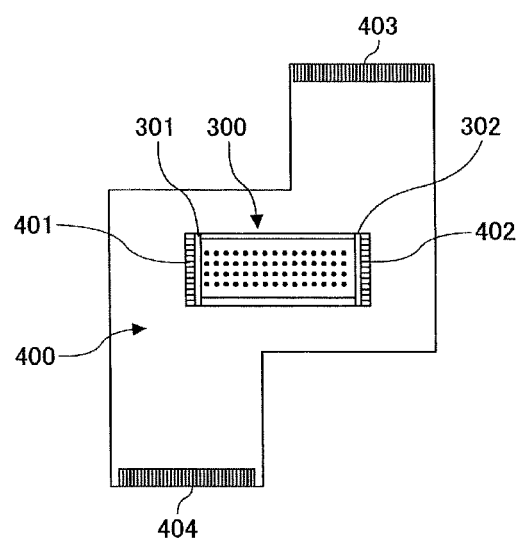
FIG. 22 is a plan explanatory view of a FPC having a head mounted thereon according to a seventh embodiment of the present invention.

Referring to FIG. 22, a description is now made of a seventh embodiment of the present invention. Note that FIG. 22 is a plan explanatory view of a FPC having a head mounted thereon according to this embodiment. Here, connection terminal groups are arranged at both end parts in the longitudinal direction of the head 300 so as to be connected to the output terminal parts 401 and 402 of the FPC 400. Thus, the arrangements of the connection parts of the head and the output terminal parts of the FPC are not limited to the embodiments described above.

Figure 23:
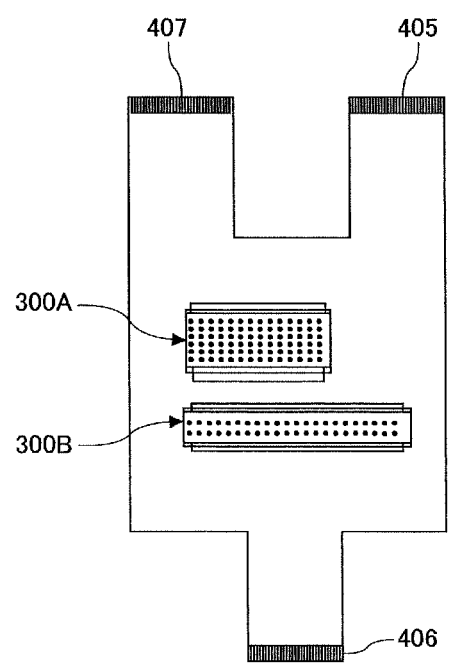
FIG. 23 is a plan explanatory view of a FPC having heads mounted thereon according to an eighth embodiment of the present invention.

Referring to FIG. 23, a description is now made of an eighth embodiment of the present invention. Note that FIG. 23 is a plan explanatory view of heads mounted on a FPC according to this embodiment.

Here, two heads 300A and 300B having an electrostatic actuator as a driving element are mounted on the FPC 400, and the FPC 400 has three input terminal parts 405, 406, and 407. The head 300A ejects, for example, liquid droplets of color ink, and the head 300B ejects, for example, liquid droplets of black ink.

The input terminal part 406 of the FPC 400 is configured so as not to face (not to be overlapped with) the other two input terminal parts 405 and 407 when folded. Accordingly, it is possible to attain the downsizing of the head unit. As described above, the number of the input terminal parts may be two or more in the present invention, and the number of the input terminal parts and the driving elements are not limited to this embodiment.

Note also here that it is possible to use as driving elements a thermal actuator that employs thermal electric conversion elements such as heat generation resistances to use phase changes due to the film boiling of a liquid and the piezoelectric actuator described above, etc., besides the electrostatic actuator that employs an electrostatic force.

Figure 24:
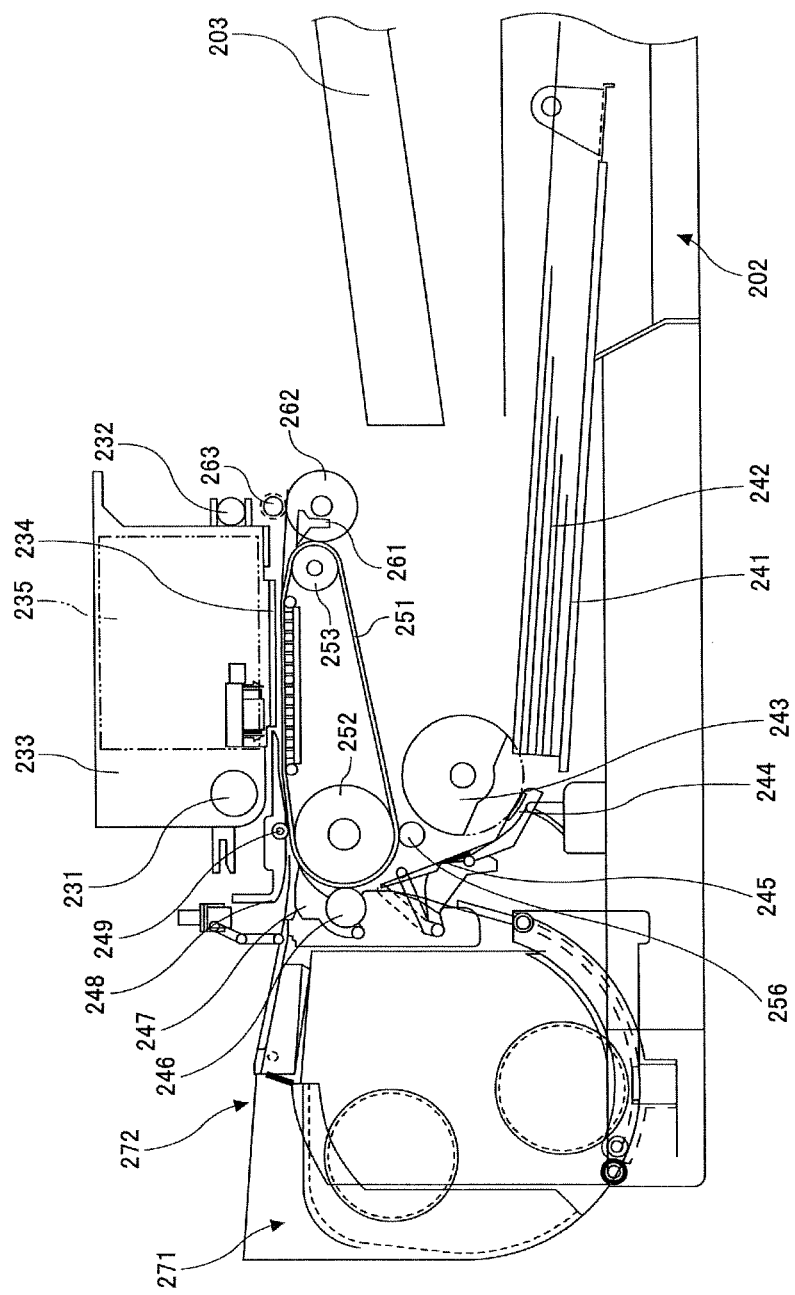
FIG. 24 is a schematic view for explaining the entire configuration of a mechanism part of an image forming apparatus having the liquid ejection head according to the embodiments of the present invention.
Figure 25:
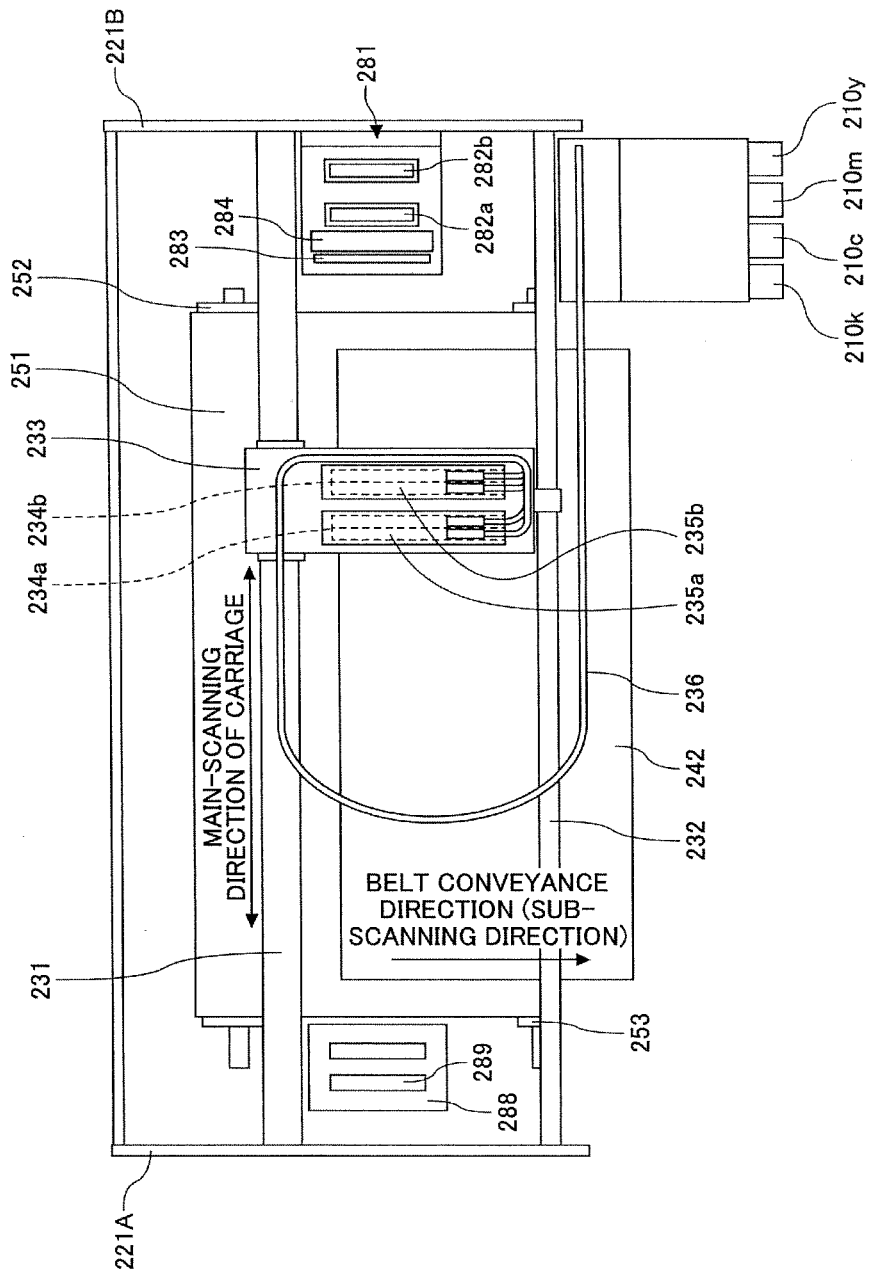
FIG. 25 is a substantial-part plan explanatory view of the mechanism part.

Referring to FIGS. 24 and 25, a description is now made of an example of an image forming apparatus having the liquid ejection head according to the embodiments of the present invention. Note that FIG. 24 is a schematic view for explaining the entire configuration of the mechanism part of the apparatus, and FIG. 25 is a substantial-part plan explanatory view of the mechanism part.

The image forming apparatus is of a serial type in which a carriage 233 is slidably held in the main-scanning direction with guide rods 231 and 232 serving as guide members laterally bridged between right and left side plates 221A and 221B and the carriage 233 is caused to move for scanning in the direction as indicated by an arrow through a timing belt driven by a main-scanning motor (not shown).

In the carriage 233, there are installed recording heads 234a and 234b (hereinafter referred to as a "recording head 234" when they are not discriminated) composed of the liquid ejection heads according to the embodiments of the present invention that eject respective colors (yellow (Y), cyan (C), magenta (M), and black (K)) of ink droplets. In this case, nozzle rows each having plural nozzles are arranged in the sub-scanning direction orthogonal to the main-scanning direction, and the ejecting direction of the ink droplets is downward.

The recording head 234 has two nozzle rows each. The recording head 234a causes black (K) liquid droplets to be ejected from the nozzles of one nozzle row and cyan (C) liquid droplets to be ejected from those of the other nozzle row. The recording head 234b causes magenta (M) liquid droplets to be ejected from the nozzles of one nozzle row and yellow (Y) liquid droplets to be ejected from those of the other nozzle row.

Furthermore, the carriage 233 has head tanks 235a and 235b (hereinafter referred to as a "head tank 235" when they are not discriminated) mounted thereon for supplying the respective colors of ink corresponding to the nozzle rows of the recording head 234. The colors of ink are replenished and supplied from respective colors of ink cartridges 210k, 210c, 210m, and 210y to the head tank 235 through corresponding colors of supplying tubes 236.

As parts of a sheet feeding unit that feeds sheets 242 stacked on a sheet loading part (pressure plate) 241 of a sheet feeding tray 202, there are provided a semi-circular roller (sheet feeding roller) 243 that separates the sheets 242 from the sheet loading part 241 one by one and feeds the same and a separation pad 244 that faces the sheet feeding roller 243 and is made of a material having a large friction coefficient. The separation pad 244 is biased to the side of the sheet feeding roller 243.

Furthermore, as parts of a conveyance unit that conveys the sheet 242 fed from the sheet feeding unit to the lower side of the recording head 234, there are provided a guide member 245 that guides the sheet 242, a counter roller 246, a conveyance guide member 247, a pressing member 248 having a tip-end pressurizing roller 249, and a conveyance belt 251 as a conveyance unit that electrostatically attracts the fed sheet 242 and conveys the same to the position where it faces the recording head 234.

The conveyance belt 251 is an endless belt, which is bridged between a conveyance roller 252 and a tension roller 253 and rotates in the belt conveyance direction (sub-scanning direction). In addition, there is provided a charging roller 256 as a charging unit that charges the front surface of the conveyance belt 251. The charging roller 256 is brought into contact with the front layer of the conveyance belt 251 and arranged to rotate in conjunction with the rotation of the conveyance belt 251. The conveyance belt 251 rotates in the belt conveyance direction when the conveyance roller 252 is rotated and driven by a sub-scanning motor (not shown) with timing.

Moreover, as parts of a sheet discharging unit that discharges the sheet 242 recorded by the recording head 234, there are provided a separation claw 261 that separates the sheet 242 from the conveyance belt 251, a sheet discharging roller 262, a sheet discharging roller 263, and a sheet catching tray 203 arranged below the sheet discharging roller 262.

Furthermore, a double-sided unit 271 is detachably attached to the back surface side of an apparatus main body. The double-sided unit 271 receives the sheet 242 returned when the conveyance belt 251 is rotated in the reverse direction and turns the same upside down, and then it feeds the inverted sheet 242 to the area between the counter roller 246 and the conveyance belt 251 again. Furthermore, the top surface of the double-sided unit 271 serves as a manual sheet feeding tray 272.

Moreover, in a non-printing area on one side in the scanning direction of the carriage 233, there is provided a maintenance and recovery mechanism 281 that maintains and restores the condition of the nozzles of the recording head 234. The maintenance and recovery mechanism 281 has cap members 282a and 282b (hereinafter referred to as a "cap 282" when they are not discriminated) that cap the nozzle surfaces of the recording head 234, a wiper blade 283 serving as a blade member that wipes out the nozzle surfaces, an idle-ejection receiver 284 that receives liquid droplets ejected when an idle ejection for ejecting the liquid droplets that do not contribute to recording is performed so as to eject a thickened recording liquid, etc.

Furthermore, in the non-printing area on the other side in the scanning direction of the carriage 233, there is provided an ink collection unit (idle-ejection receiver) 288 serving as a liquid collection container that receives liquid droplets ejected when an idle ejection for ejecting the liquid droplets that do not contribute to recording is performed so as to eject a thickened recording liquid during the recording. The ink collection unit 288 has, for example, an opening part 289 along the direction of the nozzle rows of the recording head 234.

In the image forming apparatus thus configured, the sheets 242 are separated and fed from the sheet feeding tray 202 one by one. Then, the sheet 242 fed in a substantially vertical direction is guided by the guide member 245 and conveyed in such a manner as to be held between the conveyance belt 251 and the counter roller 246. After that, the sheet 242 is pressed against the conveyance belt 251 by the tip-end pressurizing roller 249 with its tip end guided by the conveyance guide member 249 and caused to change its conveyance direction by approximately 90 degrees.

At this time, an alternating voltage is applied to the charging roller 256 so that positive and negative outputs are alternately repeated. As a result, the conveyance belt 251 is charged with an alternating charged voltage pattern. In other words, positive and negative voltages are alternately applied onto the conveyance belt 251 in a strip shape with a predetermined width in the sub-scanning direction as the revolving direction of the charging roller 256. When the sheet 242 is fed onto the conveyance belt 251 onto which the positive and negative voltages are alternately applied, it is attracted onto the conveyance belt 251 and conveyed in the sub-scanning direction in conjunction with the rotation of the conveyance belt 251.

When the recording head 234 is driven in accordance with image signals as the carriage 233 moves, ink droplets are ejected onto the sheet 242 so as to perform recording for one line. After the sheet 242 is conveyed by a predetermined amount, it undergoes recording for the next line. When receiving a recording end signal or a signal indicating that the rear end of the sheet 242 has reached a recording area, the image forming apparatus ends the recording operation and discharges the sheet 242 to the sheet catching tray 203.

As described above, the image forming apparatus has the liquid ejection head according to the embodiments of the present invention, thus attaining the downsizing of the apparatus.

Figure 1:
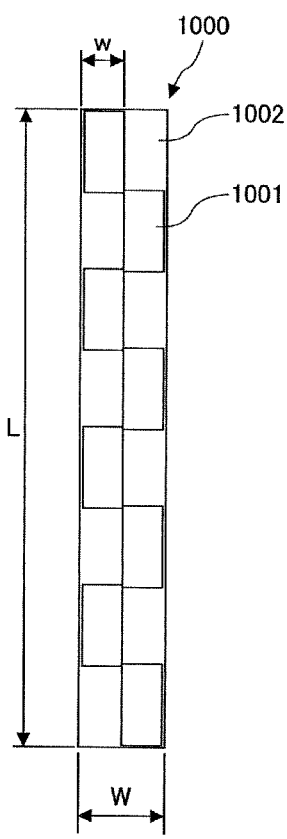
FIG. 1 is a view for explaining an example of a line-type head.

Note that according to above embodiments the present invention is applied to the image forming apparatus having a printer configuration. However, without being limited to this, it can be applied to image forming apparatuses such as printers, facsimile machines, copiers, or multi-task machines. Furthermore, it can also be applied to liquid ejection heads and image forming apparatuses using a recording liquid, a resist, a DNA sample, etc., as a liquid other than ink. Moreover, it can also be applied to the line-type liquid ejection head such as the head unit shown in FIG. 1 or line-type image forming apparatuses.

The present application is based on Japanese Priority Application No. 2007-297739 filed on Nov. 16, 2007, with the Japan Patent Office, the entire contents of which are hereby incorporated by reference.

The invention claimed is:

1. A liquid ejection head comprising:
   at least two driving element rows in which plural driving elements that generate energy for ejecting a liquid droplet from a nozzle are arranged side by side;
   a wiring board arranged on a backside of a liquid droplet ejection surface of a nozzle plate in which the nozzle is formed; and
   at least two sheets of flexible printed circuits that are provided to correspond to the respective driving element rows and have output terminal parts connected to the plural driving elements and input terminal parts connected to the wiring board, the input terminal parts being drawn to the side of the wiring board; wherein
   the flexible printed circuits are arranged facing each other with their input terminal parts not facing each other, and the input terminal parts of the flexible printed circuits are folded in a direction where the flexible printed circuits face each other and are connected to the wiring board,
   wherein the input terminal parts of the flexible printed circuits are provided parallel to the output terminal parts, and
   a length of the input terminal parts is half or less of a length of the output terminal parts in a direction of the driving element rows.

2. The liquid ejection head according to claim 1, wherein the wiring board is a print wiring board having a bypass condenser mounted thereon.

3. The liquid ejection head according to claim 1, wherein a space between the input terminal parts in a direction where the input terminal parts of the flexible printed circuits are arranged is positioned at a central part between the driving element rows.

4. An image forming apparatus having the liquid ejection head according to claim 1.

5. The liquid ejection head according to claim 1, wherein the plural flexible printed circuits are identical in shape.

6. The liquid ejection head according to claim 1, further comprising a frame member surrounding the driving element rows, wherein the frame member has a nozzle-side surface and a rear surface opposite to the nozzle-side surface, and the wiring board is mounted on the rear surface of the frame member.

7. A liquid ejection head comprising:
   three or more driving element rows in which plural driving elements that generate energy for ejecting a liquid droplet from a nozzle are arranged side by side;
   a wiring board arranged on a backside of a liquid droplet ejection surface of a nozzle plate in which the nozzle is formed; and
   at least three or more rows of flexible printed circuits that are provided to correspond to the respective driving element rows and have output terminal parts connected to the plural driving elements and input terminal parts connected to the wiring board, the input terminal parts being drawn to a side of the wiring board; wherein
   the input terminal parts of the flexible printed circuits are folded and connected to the wiring board, the input terminal parts of the flexible printed circuits being positioned outside from among the three or more rows of the flexible printed circuits being folded in a direction where the flexible printed circuits are arranged and connected to the wiring board,
   wherein the input terminal parts of the flexible printed circuits are provided parallel to the output terminal parts, and
   a length of the input terminal parts is half or less of a length of the output terminal parts in a direction of the driving element rows.

8. The liquid ejection head according to claim 7, wherein the wiring board is a print wiring board having a bypass condenser mounted thereon.

9. An image forming apparatus having the liquid ejection head according to claim 7.

10. The liquid ejection head according to claim 7, wherein a space between the input terminal parts in a direction where the input terminal parts of the flexible printed circuits are arranged is positioned at a central part between the driving element rows.

11. The liquid ejection head according to claim 7, wherein the plural flexible printed circuits are identical in shape.

12. A liquid ejection head comprising:
    at least two driving element rows in which plural driving elements that generate energy for ejecting a liquid droplet from a nozzle are arranged side by side;
    a wiring board arranged on a backside of a liquid droplet ejection surface of a nozzle plate in which the nozzle is formed; and
    a sheet of flexible printed circuit that is provided to correspond to the driving element rows and has output terminal parts connected to the plural driving elements and input terminal parts connected to the wiring board; wherein
    the flexible printed circuit has first and second input terminal parts,
    at least parts of wiring areas continuing to the first and second input terminal parts face each other, and
    the first and second input terminal parts are folded in a direction where at least the parts of the wiring areas continuing to the first and second input terminal parts face each other and are connected to the wiring board at a surface parallel to the nozzle plate, the first and second input terminal parts being arranged at positions where the first and second input terminal parts do not face each other in the direction where at least the parts of the wiring areas continuing to the first and second input terminal parts face each other.

13. The liquid ejection head according to claim 12, wherein the wiring board is a print wiring board having a bypass condenser mounted thereon.

14. An image forming apparatus having the liquid ejection head according to claim 12.

* * * * *